(12) United States Patent
Wu et al.

(10) Patent No.: US 12,483,772 B2
(45) Date of Patent: Nov. 25, 2025

(54) IMAGE SENSOR PACKAGE AND ENDOSCOPE

(71) Applicant: Medimaging Integrated Solution, Inc., Hsinchu (TW)

(72) Inventors: Shangyi Wu, Hsinchu (TW); Jia-De Zhou, Hsinchu (TW); Chih Lung Hsu, Hsinchu (TW); Jiunwei Chen, Hsinchu (TW)

(73) Assignee: MEDIMAGING INTEGRATED SOLUTION, INC., Hsinchu (TW)

( * ) Notice: Subject to any disclaimer, the term of this patent is extended or adjusted under 35 U.S.C. 154(b) by 201 days.

(21) Appl. No.: 18/124,201

(22) Filed: Mar. 21, 2023

(65) Prior Publication Data

US 2023/0308738 A1 Sep. 28, 2023

(30) Foreign Application Priority Data

Mar. 22, 2022 (TW) .................................. 111110697

(51) Int. Cl.
*H04N 23/56* (2023.01)
*A61B 1/00* (2006.01)
(Continued)

(52) U.S. Cl.
CPC .......... *H04N 23/56* (2023.01); *A61B 1/00097* (2022.02); *A61B 1/0684* (2013.01);
(Continued)

(58) Field of Classification Search
CPC ...... H04N 23/52; H04N 23/54; H04N 23/555; H04N 23/56; H01L 23/34; H01L 23/60;
(Continued)

(56) References Cited

U.S. PATENT DOCUMENTS

| 4,919,114 A | * | 4/1990 | Miyazaki | ........... G02B 23/2476 |
| | | | | 600/110 |
| 12,004,719 B2 | * | 6/2024 | Wu | .................... H01L 27/14636 |

(Continued)

FOREIGN PATENT DOCUMENTS

| CN | 102008281 A | * | 4/2011 | ............. A61B 1/041 |
| CN | 103258830 A | * | 8/2013 | ........ H01L 27/14618 |

(Continued)

*Primary Examiner* — Behrooz M Senfi
(74) *Attorney, Agent, or Firm* — Muncy, Geissler, Olds & Lowe, P.C.

(57) ABSTRACT

An image sensor package includes a substrate, an image sensor, and at least one light-emitting element. The substrate has a plurality of electric-conduction contacts. The image sensor is arranged on the substrate electrically connected with the substrate. The light-emitting element includes a spacer and a light-emitting diode. The spacer has a plurality of electric-conduction contacts. The light emitting diode is arranged on the spacer and electrically connected with the
(Continued)

spacer. The spacer is arranged on the substrate and electrically connected with the substrate. The spacer has a predetermined thickness, so that the height of a light input surface of the image sensor is larger than or equal to the height of a light output surface of the light-emitting diode. The above-mentioned image sensor package favors optimization of illumination. An endoscope including the above-mentioned image sensor package is also disclosed.

25 Claims, 8 Drawing Sheets

(51) Int. Cl.
| | |
|---|---|
| A61B 1/06 | (2006.01) |
| H01L 23/34 | (2006.01) |
| H01L 23/60 | (2006.01) |
| H04N 23/50 | (2023.01) |
| H04N 23/52 | (2023.01) |
| H10F 55/255 | (2025.01) |
| H10F 77/30 | (2025.01) |
| H10F 77/50 | (2025.01) |

(52) U.S. Cl.
CPC .............. *H01L 23/34* (2013.01); *H01L 23/60* (2013.01); *H04N 23/52* (2023.01); *H04N 23/555* (2023.01); *H10F 55/255* (2025.01); *H10F 77/334* (2025.01); *H10F 77/50* (2025.01)

(58) Field of Classification Search
CPC ... H01L 25/167; H10F 55/255; H10F 77/334; H10F 77/50; A61B 1/00097; A61B 1/051; A61B 1/0607; A61B 1/0676; A61B 1/0684
USPC .......................................................... 348/68
See application file for complete search history.

(56) References Cited

U.S. PATENT DOCUMENTS

| | | | | |
|---|---|---|---|---|
| 12,178,407 | B2 * | 12/2024 | Wu | ....................... A61B 1/0607 |
| 2018/0040660 | A1 * | 2/2018 | Kondo | .................. H10F 39/809 |
| 2019/0246027 | A1 * | 8/2019 | Kuhn | .................... A61B 1/0011 |
| 2021/0037169 | A1 * | 2/2021 | Numasawa | ............ A61B 1/051 |

FOREIGN PATENT DOCUMENTS

| | | | | | |
|---|---|---|---|---|---|
| JP | | 2006000664 A | * | 1/2006 | ............... A61B 1/04 |
| WO | WO-2016203824 A1 | * | 12/2016 | ......... A61B 1/00124 |

* cited by examiner

IMAGE SENSOR PACKAGE AND ENDOSCOPE

BACKGROUND OF THE INVENTION

1. Field of the Invention

The present invention relates to an image sensor package and an endoscope, particularly to an image sensor package containing illumination elements and an endoscope using the same.

2. Description of the Prior Art

An endoscope can reach cavities, which the naked eyes are unlikely to observe directly. Therefore, endoscopes have been extensively used in industry and medicine. Especially, the application of endoscopes to medicine favors medical diagnosis very much. An endoscope may access cavities of a human body through tiny channels of the human body. For an example, an endoscope may reach the lung through a bronchial tube. For another example, an endoscope may enter the bladder through the urinary tract. Hence, miniaturizing an endoscope has become an important subject of the concerned field.

Refer to FIG. 1. In a conventional endoscope 10, an image sensor 11 and light-emitting elements 12 are disposed on a flexible circuit board 13; cables 14 are soldered to the corresponding electric-conduction contacts 131 of the flexible circuit board 13. After the flexible circuit board 13 is bent to have the desired shape, the abovementioned elements are encapsulated with a plastic material to assume a fixed form in an injection-molding method. The conventional technology is more complicated in the structure and fabrication process. Further, the endoscope 10 has a larger size. Besides, the light output surfaces of the light-emitting elements 12 are unlikely to face upwards, and the light-emitting elements 12 is hard to be disposed around the image sensor 11. Therefore, the conventional endoscope has disadvantages of low light utilization efficiency, non-uniform illumination, and likeliness of shadows and blind spots.

Accordingly, the manufacturers are eager to develop an endoscope that is miniaturized and able to provide uniform illumination.

SUMMARY OF THE INVENTION

The present invention provides an image sensor package and an endoscope using the same, wherein light-emitting diodes (LEDs) are disposed on a spacer and electrically connected with a substrate containing an image sensor through the spacer, whereby to increase the layout flexibility of LEDs, dispose LEDs near the image sensor, and decrease the size of the image sensor package. Besides, the present invention can optimize the difference between the height of the light output surface of LEDs and the height of the light input surface of the image sensor to achieve better quality of illumination and images.

In one embodiment, the image sensor package comprises a substrate, an image sensor, and at least one light-emitting element. The substrate has a first surface and a second surface opposite to the first surface. The first surface has a plurality of first electric-conduction contacts; the second surface has a plurality of second electric-conduction contacts and a plurality of third electric-conduction contacts. The plurality of second electric-conduction contacts and the plurality of third electric-conduction contacts are respectively electrically connected with the plurality of corresponding first electric-conduction contacts. The image sensor is disposed on the second surface of the substrate and electrically connected with the plurality of second electric-conduction contacts. The light-emitting element includes a spacer and at least one LED. The spacer has a third surface and a fourth surface opposite to the third surface. The third surface has a plurality of fourth electric-conduction contacts; the fourth surface has a plurality of fifth electric-conduction contacts. The plurality of fifth electric-conduction contacts is electrically connected with the plurality of corresponding fourth electric-conduction contacts. The LED is disposed on the fourth surface of the spacer and electrically connected with the plurality of fifth electric-conduction contacts. The light-emitting element is disposed on the second surface of the substrate and neighbors the image sensor. The plurality of fourth electric-conduction contacts is electrically connected with the plurality of corresponding third electric-conduction contacts. The spacer has a predetermined thickness to make a light input surface of the image sensor higher than a light output surface of the LED and the difference of their heights smaller than or equal to a predetermined value.

In one embodiment, the endoscope of the present invention comprises a tube, an image sensor package, a plurality of cables, and an electric connector. The tube includes a first opening and a second opening. The end of the first opening of the tube is extended to a cavity. The image sensor package is disposed at the end of the first opening of the tube to capture images of the cavity and generate corresponding electronic signals. The image sensor package includes a substrate, an image sensor, and at least one light-emitting element. The substrate has a first surface and a second surface opposite to the first surface. The first surface has a plurality of first electric-conduction contacts; the second surface has a plurality of second electric-conduction contacts and a plurality of third electric-conduction contacts. The plurality of second electric-conduction contacts and the plurality of third electric-conduction contacts are respectively electrically connected with the plurality of corresponding first electric-conduction contacts. The image sensor is disposed on the second surface of the substrate and electrically connected with the plurality of second electric-conduction contacts. The light-emitting element includes a spacer and at least one LED. The spacer has a third surface and a fourth surface opposite to the third surface. The third surface has a plurality of fourth electric-conduction contacts; the fourth surface has a plurality of fifth electric-conduction contacts. The plurality of fifth electric-conduction contacts is electrically connected with the plurality of corresponding fourth electric-conduction contacts. The LED is disposed on the fourth surface of the spacer and electrically connected with the plurality of fifth electric-conduction contacts. The light-emitting element is disposed on the second surface of the substrate and neighbors the image sensor. The plurality of fourth electric-conduction contacts is electrically connected with the plurality of corresponding third electric-conduction contacts. The spacer has a predetermined thickness to make a light input surface of the image sensor higher than a light output surface of the LED and the difference of their heights smaller than or equal to a predetermined value. The plurality of cables is disposed inside the tube. First connection ends of the plurality of cables are electrically connected with the plurality of corresponding first electric-conduction contacts of the substrate. The electric connector is electrically connected with second connection ends of the plurality of cables, whereby the endoscope can be electrically connected with an external electronic device in a pluggable way.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
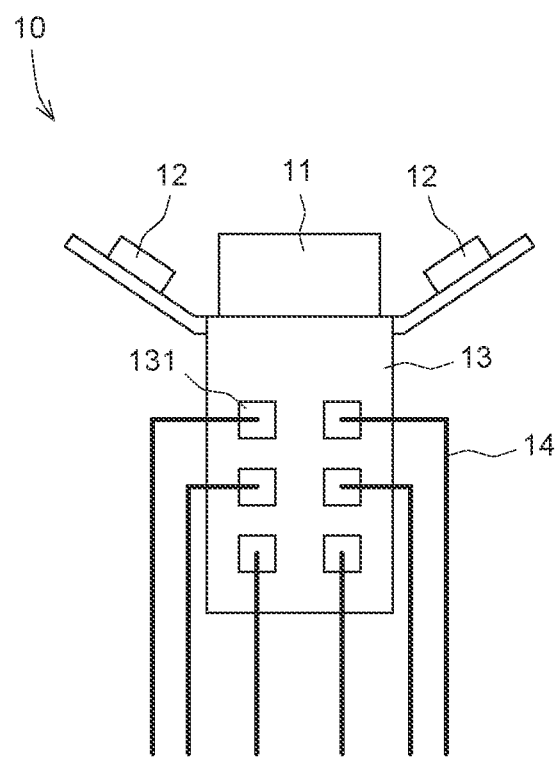
FIG. 1 is a diagram schematically showing the structure of a conventional endoscope.
Figure 2:
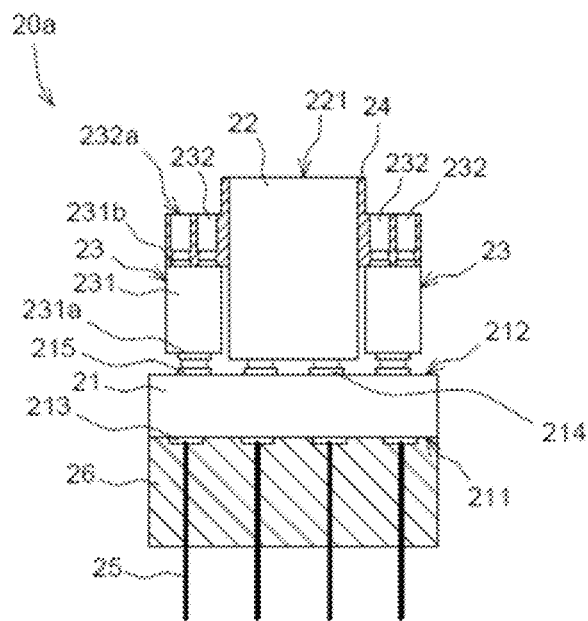
FIG. 2 is a diagram schematically showing an image sensor package according to a first embodiment of the present invention.
Figure 4:
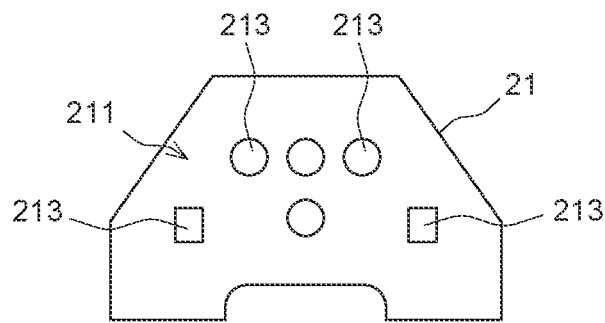
FIG. 4 is a diagram schematically showing the structure of a first surface of a substrate of the image sensor package according to one embodiment of the present invention.
Figure 5:
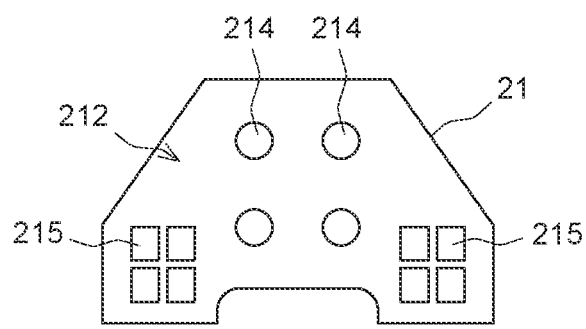
FIG. 5 is a diagram schematically showing the structure of a second surface of a substrate of the image sensor package according to one embodiment of the present invention.

Refer to FIG. 2. In one embodiment, the image sensor package 20a of the present invention comprises a substrate 21, an image sensor 22, and at least one light-emitting element 23. Refer to FIG. 4 and FIG. 5 also. The substrate 21 has a first surface 211 and a second surface 212 opposite to the first surface 211. The first surface 211 of the substrate 21 has a plurality of first electric-conduction contacts 213. The second surface 212 of the substrate 21 has a plurality of second electric-conduction contacts 214 and a plurality of third electric-conduction contacts 215. The plurality of second electric-conduction contacts 214 and the plurality of third electric-conduction contacts 215 are respectively electrically connected with the plurality of corresponding first electric-conduction contacts 213 through metal routes of the substrate 21 or other appropriate electric-conduction paths. In one embodiment, the substrate 21 may be a ceramic substrate. The image sensor 22 is disposed on the second surface 212 of the substrate 21 and electrically connected with the plurality of second electric-conduction contacts 214.

The plurality of light-emitting elements 23 is disposed on the second surface 212 of the substrate 21, adjacent to the image sensor 22. Each light-emitting element 23 includes at least one spacer 231 and at least one light-emitting diode) LED 232. The spacer 231 has a third surface (e.g. the downward surface of the spacer 231 in FIG. 2) and a fourth surface (e.g. the upward surface of the spacer in FIG. 2), which are opposite to each other. The third surface of the spacer 231 has a plurality of fourth electric-conduction contacts 231a. The fourth surface of the spacer 231 has a plurality of fifth electric-conduction contacts 231b. The plurality of fifth electric-conduction contacts 231b is electrically connected with the plurality of corresponding fourth electric-conduction contacts 231a through metal routes or other appropriate electric-conduction paths of the substrate 21. The LED 232 is disposed on the fourth surface of the spacer 231 and electrically connected with the plurality of fifth electric-conduction contacts 231b.

The plurality of fourth electric-conduction contacts 231a of the light-emitting element 23 is electrically connected with the plurality of corresponding third electric-conduction contacts 215 of the substrate 21. For example, tin paste, silver glue, or another appropriate means, is used to join the plurality of fourth electric-conduction contacts 231a of the light-emitting element 23 with the plurality of corresponding third electric-conduction contacts 215 of the substrate 21 to form electric-conduction paths. Therefore, the LED 232 may be electrically connected with an external circuit to acquire power or receive control signals through the electric-conduction path from the plurality of fifth electric-conduction contacts 231b and the plurality of fourth electric-conduction contacts 231a of the spacer 231 to the plurality of third electric-conduction contacts 215 and the plurality of first electric-conduction contacts 213 of the substrate 21.

Refer to FIG. 2 again. In one embodiment, the image sensor package 20a of the present invention comprises a plurality of light-emitting elements 23. The plurality of light-emitting elements 23 emits lights respectively having different wavelengths and may be simultaneously or separately operated to meet different observation targets. Further, each light-emitting element 23 may include a plurality of LEDs 232, and the plurality of LEDs 232 may respectively emit lights having different wavelengths. It is easily understood: the plurality of light-emitting elements 23 or the plurality of LEDs 232 of each light-emitting element 23 may emit lights having the same wavelength for illumination or another objective. In one embodiment, the number of the plurality of first electric-conduction contacts 213 can be re-configured via the design of the metal routes of the substrate 21. For example, the plurality of positive electrodes and negative electrodes of the third electric-conduction contacts 215, which is electrically connected with the plurality of LEDs 232, may be integrated into a positive electrode and a negative electrode of the first electric-conduction contacts 213, such as the square electrodes shown in FIG. 4, via the design of the metal routes of the substrate 21. In one embodiment, the light-emitting elements 23 may be white LEDs, infrared LEDs, blue LEDs, ultra-violet LEDs, or a combination thereof.

It is easily understood: the relative altitude of the image sensor 22 and the light-emitting elements 23 may influence quality of illumination and images. For example, if light output surfaces 232a of the light-emitting elements 23 are too low with respect to the image sensor 22, the illumination light generated by the light-emitting elements 23 may be blocked by the image sensor 22, and shadows thus form. If the light input surface 221 of the image sensor 22 is too low with respect to the light-emitting elements 23, the imaging light reflected from the inspected object may be blocked by the light-emitting elements 23, or the illumination light generated by the light-emitting elements 23 may directly project onto the light input surface 221 of the image sensor 22. According to the structure shown in FIG. 2, merely adjusting the thickness of the spacer 231 is sufficient to control the relative altitude of the light input surface 221 of the image sensor 22 and the light output surfaces 232a of the LEDs 232 and optimize the quality of illumination and images. In one embodiment, the spacer 231 has a predetermined thickness, which makes the height of the light input surface 221 of the image sensor 22 equal to or greater than the height of light output surfaces 232a of the LEDs 232 and also makes the difference of the heights smaller than or equal to a predetermined value. For example, the difference of the height of the light input surface 221 of the image sensor 22 and the height of light output surfaces 232a of the LEDs 232 is smaller than or equal to 0.8 mm.

Figure 3:
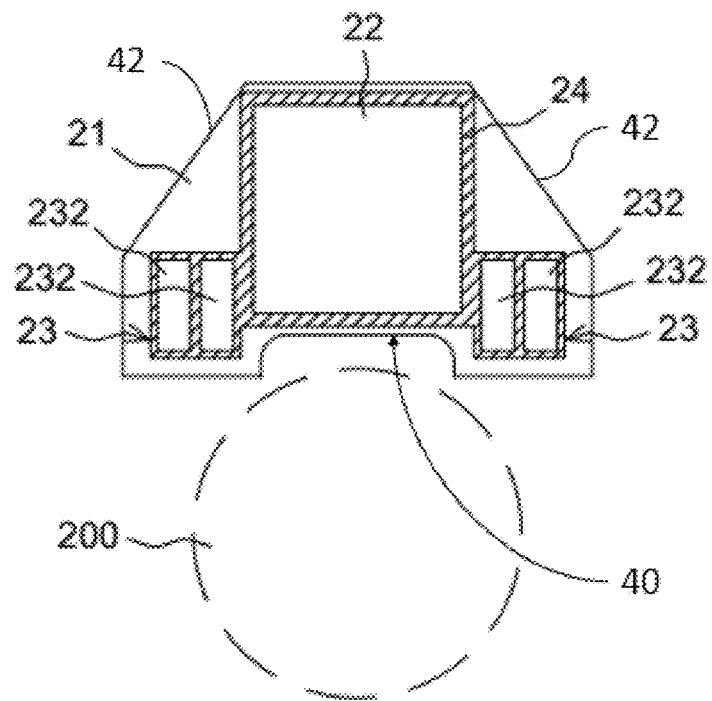
FIG. 3 is a diagram schematically showing a top view of the image sensor package and a relative position of the image sensor and a working channel according to the first embodiment of the present invention.

Refer to FIG. 2 and FIG. 3. In one embodiment, the image sensor package of the present invention comprises a plurality of light-emitting elements 23, and the light-emitting elements 23 are separated apart from each other in space. Based on the abovementioned structure, the size of each light-emitting element 23 may be significantly reduced to increase the layout flexibility of the light-emitting elements 23 and decrease the volumes of the image sensor package and endoscope. For example, the boundary of the LEDs 232 may approach the boundary of the spacer 231 as much as possible to greatly decrease the volume of the light-emitting element 23. The plurality of light-emitting elements 23, which are separated apart from each other in space, may be arbitrarily disposed on the substrate 21. For example, the light-emitting elements 23 are obliquely disposed on the substrate 21 with respect to the image sensor 22, whereby the light-emitting elements 23 are moved toward a working channel 200. In other words, the illumination areas are moved to the positions between the image-capturing area and the opening of the working channel 200. Refer to FIG. 3. Based on the abovementioned structure, the upper boundary and lower boundary of the image sensor 22 approach the boundaries of the substrate 21, whereby the volume the image sensor package can be reduced. Besides, the recess 40 of the lower boundary of the substrate 21 may receive the working channel 200, whereby the volume of the endoscope is also reduced, two corners of an upper edge of the substrate 21 respectively have a chamfer 42. It is easily understood: the shape of the substrate 21 may be designed according to practical requirement. For example, the substrate 21 may has a polygonal shape.

Refer to FIG. 2 and FIG. 3 again. In one embodiment, the image sensor package 20a further comprises an encapsulant body 24. The encapsulant body 24 is filled into a gap between the image sensor 22 and the LEDs 232 to secure and protect the image sensor 22 and the LEDs 232. In one embodiment, the encapsulant body 24 covers the sidewalls of the image sensor 22 and the LEDs 232, as shown in FIG. 2 and FIG. 3. In one embodiment, the encapsulant body 24 is made of an opaque resin or a semi-transparent resin, whereby to prevent the illumination light or stray light generated by the LEDs 232 from directly entering the imaging system of the image sensor 22. For example, the transmittance of the semi-transparent resin may be 0.01-50%. It is easily understood: the heights of light output surfaces 232a of the LEDs 232 should be smaller than or equal to the height of the top surface of the encapsulant body 24 lest the light output of the LEDs 232 be affected. In other words, the encapsulant body 24 cannot block the light output surfaces 232a of the LEDs 232.

Figure 6:
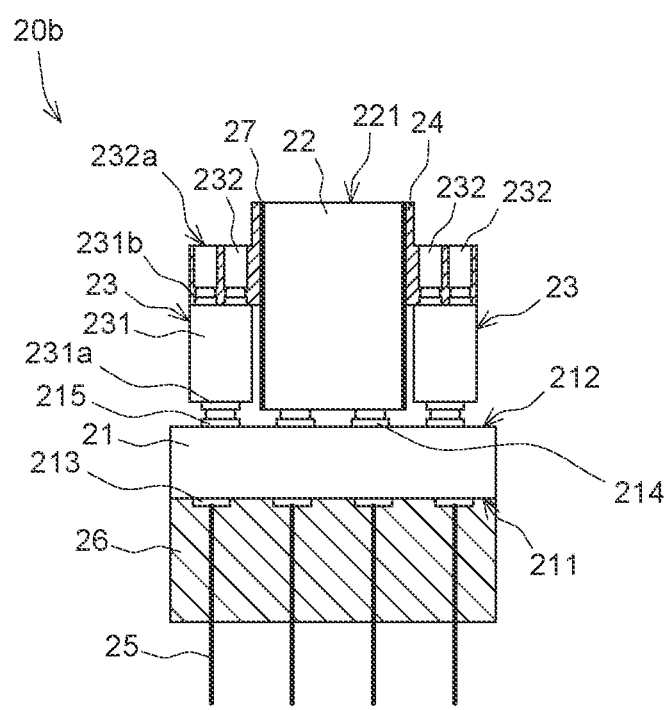
FIG. 6 is a diagram schematically showing an image sensor package according to a second embodiment of the present invention.

Refer to FIG. 6. In one embodiment, the image sensor package 20b of the present invention further comprises a light-shielding layer 27, which is disposed between image sensor 22 and the LEDs 232. For example, the light-shielding layer 27 is disposed on the sidewall of the image sensor 22, whereby to prevent the illumination light or stray light generated by the LEDs 232 from directly entering the imaging system of the image sensor 22, as shown in FIG. 6. In one embodiment, the light-shielding layer 27 may be disposed on the sidewalls of the LEDs 232, whereby to prevent the laterally-projected illumination light or stray light generated by the LEDs 232 from directly entering the imaging system of the image sensor 22. It is easily understood: in the embodiment shown in FIG. 6, the encapsulant body 24 is not limited to be made of an opaque or semi-transparent resin but may also be made of a transparent resin or a high-transparency resin.

Refer to FIG. 2 and FIG. 6 again. In one embodiment, the image sensor package 20a or 20b of the present invention further comprises a plurality of cables 25, which is electrically connected with the plurality of corresponding first electric-conduction contacts 213 of the substrate 21. The plurality of cables 25 may function as power cables or signal transmission lines, whereby the image sensor package 20a or 20b can be electrically connected with external circuits for receiving power or transmitting image signals to a rear-end controller or display device. In one embodiment, the image sensor package 20a or 20b of the present invention further comprises a protective resin 26. The protective resin 26 covers the connection points of the plurality of first electric-conduction contacts 231 and the plurality of cables 25 to prevent from detachment of the cables 25 and the first electric-conduction contacts 213 of the substrate 21.

Figure 7A:
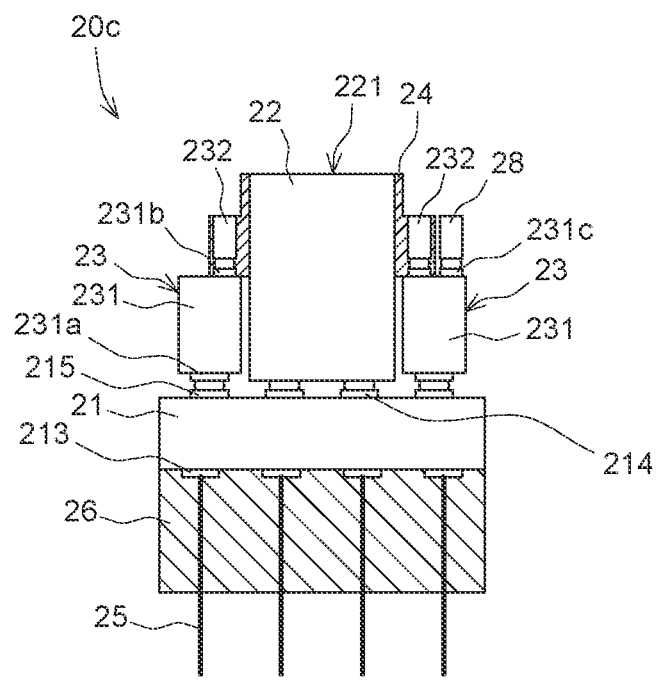
FIG. 7a is a diagram schematically showing an image sensor package according to a third embodiment of the present invention.

Refer to FIG. 7a. In one embodiment, the image sensor package 20c of the present invention further comprises a thermistor 28. The thermistor 28 is used to detect an operation temperature of the image sensor package 20c so as to guarantee that the temperature of the endoscope is within a preset temperature range during operation. For example, the thermistor 28 may be a negative-temperature-coefficient (NTC) thermistor. In one embodiment, the thermistor 28 is disposed on the fourth surface of the spacer 231 and electrically connected with the spacer 231. For example, a plurality of sixth electric-conduction contacts 231c is disposed on the fourth surface of the spacer 231 and electrically connected with the plurality of corresponding fourth electric-conduction contacts 231a. The thermistor 28 can be electrically connected with external circuits as long as the thermistor 28 is electrically connected with the plurality of sixth electric-conduction contacts 231c of the spacer 231. In the embodiment shown in FIG. 7a, each light-emitting element 23 only includes one LED 232.

Figure 7B:
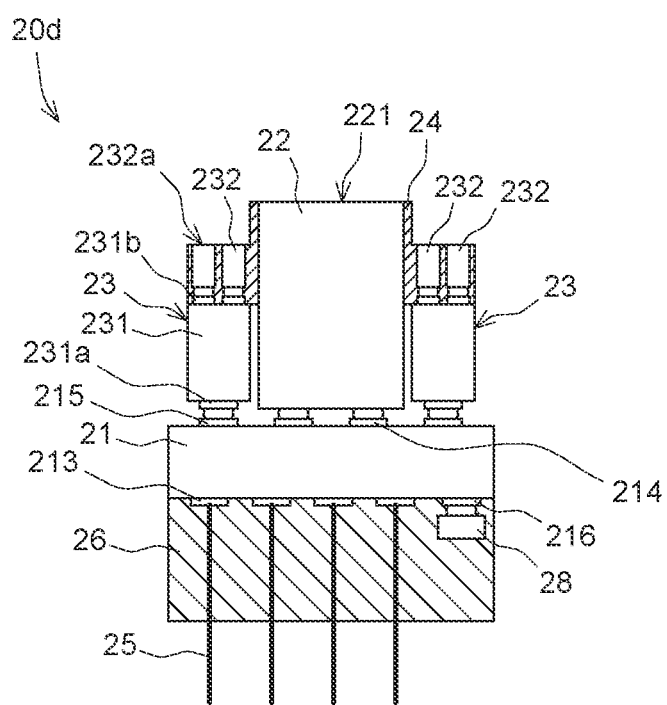
FIG. 7b is a diagram schematically showing an image sensor package according to a fourth embodiment of the present invention.

Refer to FIG. 7b. In one embodiment, the thermistor 28 of the image sensor package 20d is disposed on the first surface 211 of the substrate 21 and electrically connected with the substrate 21. Similarly, a plurality of sixth electric-conduction contacts 216 is disposed on the first surface 211 of the substrate 21 and electrically connected with the plurality of corresponding first electric-conduction contacts 213. The thermistor 28 can be electrically connected with external circuits as long as the thermistor 28 is electrically connected with the plurality of sixth electric-conduction contacts 216 of the substrate 21.

In one embodiment, the image sensor package of the present invention further comprises an electrostatic discharge (ESD) protection element. Similar to the thermistor 28, the ESD protection element may disposed on the fourth surface of the spacer 231 and electrically connected with the spacer 231. Alternatively, the ESD protection element may be disposed on the first surface 211 of the substrate 21 and electrically connected with the substrate 21. In one embodiment, the ESD protection element is designed to be in parallel with the LEDs 232, whereby to enhance the ESD protection function of the LEDs 232.

Figure 8A:
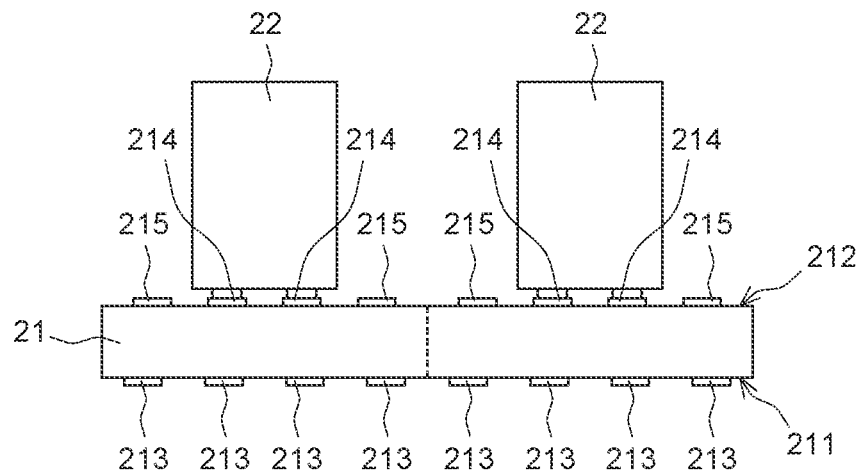
FIGS. 8a-8d are diagrams schematically showing a method of fabricating an image sensor package according to one embodiment of the present invention.

Refer to FIGS. 8a-8d for the method of fabricating the image sensor package 20a shown in FIG. 2. As shown in FIG. 8a, provide a carrier board, which contains a plurality of substrates 21 arranged in array. The substrate 21 includes a plurality of first electric-conduction contacts 213, a plurality of second electric-conduction contacts 214, and a plurality of third electric-conduction contacts 215. The plurality of second electric-conduction contacts 214 and the plurality of third electric-conduction contacts 215 are respectively electrically connected with the plurality of corresponding first electric-conduction contacts 213 through metal routes of the substrate 21 or other appropriate electric-conduction paths. Next, the image sensor 22 is placed on the substrate 21 for performing die attachment and electrically connected with the second electric-conduction contacts 214 of the substrate 21.

Figure 8B:
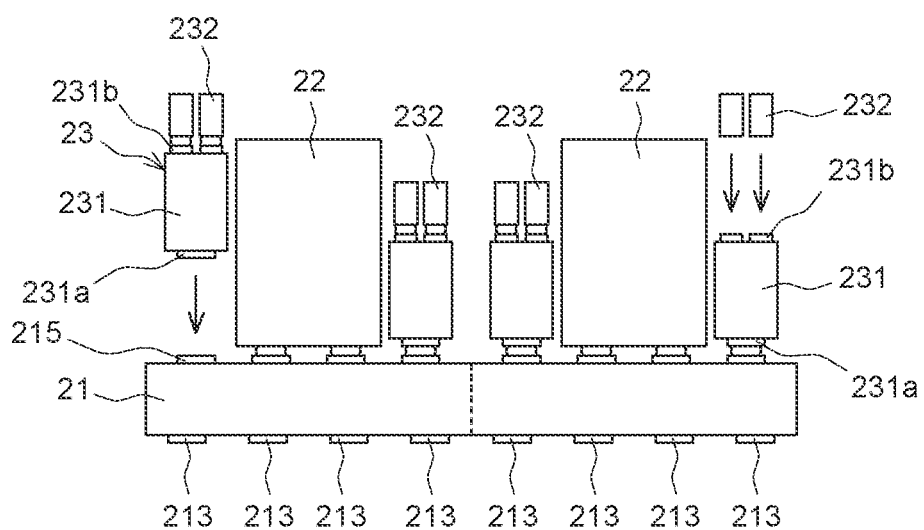

Refer to FIG. 8b. Next, fix the light-emitting elements 23 to the substrate 21 one by one, and electrically connect the plurality of fourth electric-conduction contacts 231a of the spacers 231 of the light-emitting elements 23 with the plurality of corresponding third electric-conduction contacts 215 of the substrate 21. For example, the light-emitting elements 23 may be joined to and electrically connected with the substrate 21 in a solder joint method or a eutectic bonding method. However, the present invention does not constrain that the light-emitting elements 23 must be joined to and electrically connected with the substrate 21 in one of the abovementioned two methods. For example, the plurality of fourth electric-conduction contacts 231a of the light-emitting element 23 may be joined to the plurality of corresponding third electric-conduction contacts 215 of the substrate 21 to form electric-conduction paths with tin paste, silver glue, or another appropriate means. It should be explained: the LEDs 232 may be installed on the spacer 231 to form the light-emitting element 23 beforehand; then, the light-emitting element 23 is installed on the substrate 21, as the light-emitting element 23 shown in the left side of FIG. 8b. Alternatively, the spacer 231 is installed on the substrate 21 beforehand; then, the LEDs 232 are installed on the spacer 231, as the LEDs 232 shown in the right side of FIG. 8b.

Figure 8C:
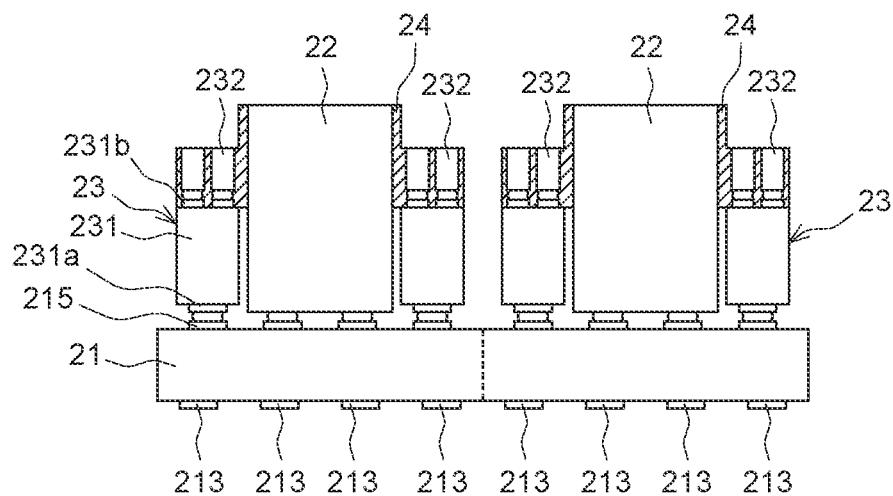

Refer to FIG. 8c. Next, the encapsulant body 24 is filled into the gap between the image sensor 22 and the LEDs 232 and then cured with ultraviolet light, heat, or another appropriate means. In one embodiment, the encapsulant body 24 covers the sidewalls of the image sensor 22 and the LEDs 232. It is easily understood: the spacer 231 had better approach the image sensor 22 as much as possible to prevent the encapsulant body 24 from being filled into the gap between the spacer 231 and the image sensor 22. Alternatively, a larger gap exists between the spacer 231 and the image sensor 22, whereby the encapsulant body 24 can flow through the gap to the space between the spacer 231 and the substrate 21 to enhance the joint strength of the spacer 231 and the substrate 21.

Figure 8D:
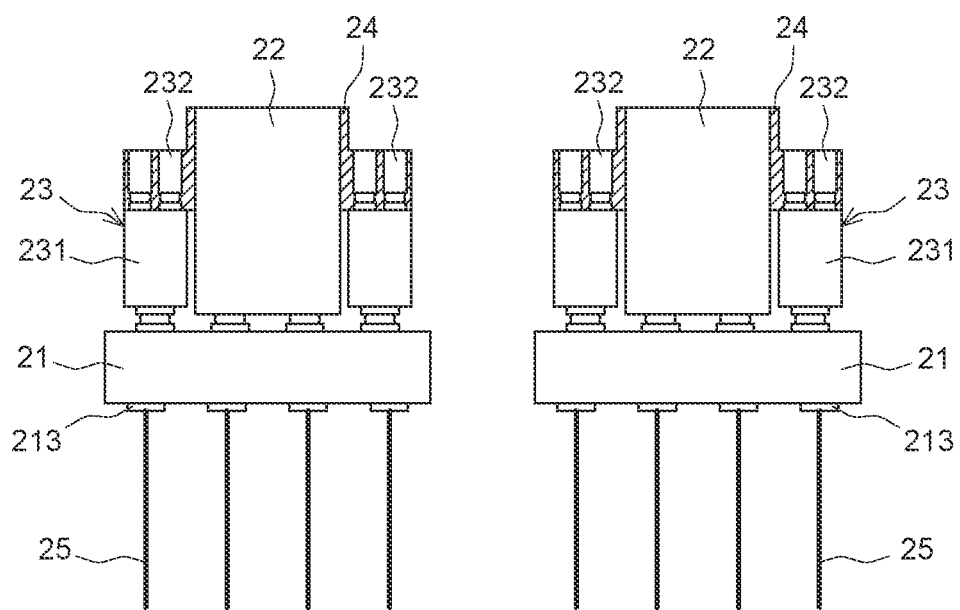
Figure 9:
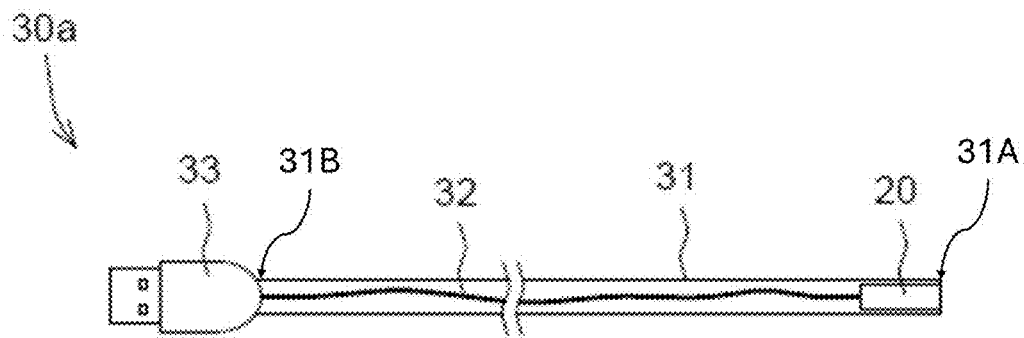
FIG. 9 is a diagram schematically showing an endoscope according to one embodiment of the present invention.

Refer to FIG. 8d. Next, cut the substrate 21 along the cutting alignment marks or the cutting lines, such as the dotted lines shown in FIG. 8c, to form the image sensor modules each including the image sensor 22 and the plurality of light-emitting elements 23, as shown in FIG. 8d. Next, electrically connect the plurality of cables 25 with the plurality of first electric-conduction contacts 213 of the substrate 21. Next, use the protective resin 26 to cover the connection points of the plurality of first electric-conduction contacts 213 and the plurality of cables 25 to form the image sensor package 20a shown in FIG. 2. It should be explained: the abovementioned image sensor package can be fabricated with the semiconductor package equipment and process; therefore, the stability and positional accuracy of the image sensor and the light-emitting elements can achieve the level of the semiconductor industry. Thereby, the image sensor package of the present invention can be miniaturized and mass-produced. Refer to FIG. 9. In one embodiment, the endoscope 30a of the present invention comprises a tube 31, an image sensor package 20, a plurality of cables 32, and an electric connector 33. The tube 31 includes a first opening 31A and a second opening 31B. The end of the first opening 31A of the tube 31 of the endoscope 30a is extended to a cavity, such as a cavity of a human body or a tiny space in industrial inspection. The electric connector 33 is disposed at the end of the second opening 31B of the tube 31. It is easily understood: the tube 31 may be designed to have different appearances to meet different applications. The image sensor package 20 is disposed at the end of the first opening 31A of the tube to capture images of a cavity and generate corresponding electronic signals. The structure of the image sensor package 20 has been described above in detail and will not repeat herein.

The cables 32 are electrically connected with the image sensor package 20 and the electric connector 33, whereby the electronic signals generated by the image sensor 20 can be transmitted to an external electronic device, such as a computer, a mobile Internet-access device, or an endoscope-dedicated electronic device. In one embodiment, the electric connector 33 may be electrically connected with an external device in a pluggable way. For example, the electric connector 33 may be a USB interface, a connection interface of a mobile Internet-access device, or another appropriate type electric connector.

Figure 10:
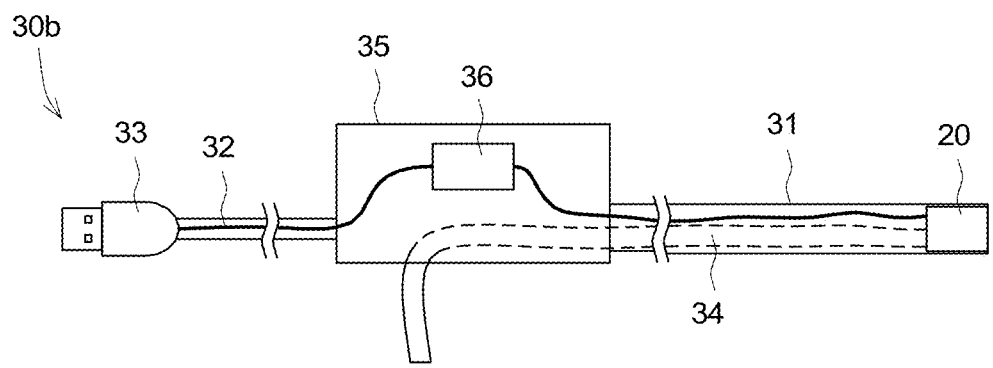
FIG. 10 is a diagram schematically showing an endoscope according to another embodiment of the present invention.

Refer to FIG. 10. In one embodiment, the tube 31 of the endoscope 30b of the present invention further comprises a working channel 34. The operator may extend a working instrument through the working channel 34 into a cavity to undertake an intended work, such as sampling tissue, sucking out secretions/tissue fluids/blood, or supplying medicine. In one embodiment, the endoscope 30b of the present invention further comprises a housing 35. The housing 35 is disposed between the tube 31 and the electric connector 33. The design of the housing 35 may be varied according to requirement. For an example, the housing 35 may have an appearance suitable to be held by the operator. For another example, the shape of the housing 35 is suitable to be installed on a carrier, such as a head-mounted carrier. In one embodiment, the endoscope 30b of the present invention further comprises an electronic element 36. The electronic element 36 is electrically connected with the image sensor package 20 and the electric connector 33. The electronic element 36 can process the electronic signals generated by the image sensor package 20 and transmit the electronic signals to an external electronic device through the electric connector 33. In one embodiment, the electronic element 36 is a microcontroller unit (MCU).

In conclusion, the present invention proposes an image sensor package and an endoscope using the same, wherein LEDs are disposed on a spacer and electrically connected a substrate containing an image sensor through the spacer. Based on the abovementioned structure, the flexibility of the layout of the LEDs is increased, and the LEDs may be disposed near the image sensor to reduce the size of the image sensor package. Further, the difference of the height of the light output surfaces of LEDs and the height of the light input surface of image sensor may be optimized merely via adjusting the thickness of the spacer to acquire better illumination quality and better imaging quality.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. An image sensor package, comprising
a substrate, having a first surface and a second surface opposite to the first surface, wherein the first surface has a plurality of first electric-conduction contacts; the second surface has a plurality of second electric-conduction contacts and a plurality of third electric-conduction contacts; the plurality of second electric-conduction contacts and the plurality of third electric-conduction contacts are respectively electrically connected with the plurality of corresponding first electric-conduction contacts, two corners of an upper edge of the substrate respectively have a chamfer, and a lower edge of the substrate is formed with a recess for accommodating a working channel;
an image sensor, disposed on the second surface of the substrate and electrically connected with the plurality of second electric-conduction contacts, wherein an upper edge and a lower edge of the image sensor are close to edges of the substrate; and
at least one light-emitting element, disposed on the substrate with an offset relative to the image sensor such that the at least one light-emitting element is shifted toward the working channel, including
a spacer, having a third surface and a fourth surface opposite to the third surface, wherein the third surface has a plurality of fourth electric-conduction contacts; the fourth surface has a plurality of fifth electric-conduction contacts; the plurality of fifth electric-conduction contacts is electrically connected with the plurality of corresponding fourth electric-conduction contacts;
at least one light-emitting diode (LED), disposed on the fourth surface of the spacer and electrically connected with the plurality of fifth electric-conduction contacts,
wherein the light-emitting element is disposed on the second surface of the substrate and neighbors the image sensor; the plurality of fourth electric-conduction contacts is electrically connected with the plurality of corresponding third electric-conduction contacts; the spacer has a predetermined thickness to make a height of a light input surface of the image sensor greater than or equal to a height of a light output surface of the LED and make a difference of the height of the light input surface and the height of the light output surface smaller than or equal to a predetermined value; and
an encapsulant body, disposed on sidewalls of the image sensor, the spacer and the LED, wherein a top surface of the package body is lower than or equal to a height of the at least one LED, and the encapsulant body does not cover a light-emitting surface of the at least one LED.

2. The image sensor package according to claim 1, further comprising
a thermistor, used to detect an operation temperature of the image sensor package.

3. The image sensor package according to claim 2, wherein the thermistor is disposed on the fourth surface of the spacer and electrically connected with a plurality of sixth electric-conduction contacts of the fourth surface; the plurality of sixth electric-conduction contacts is electrically connected with the plurality of corresponding fourth electric-conduction contacts.

4. The image sensor package according to claim 2, wherein the thermistor is disposed on the first surface of the substrate and electrically connected with a plurality of sixth electric-conduction contacts of the first surface; the plurality of sixth electric-conduction contacts is electrically connected with the plurality of corresponding first electric-conduction contacts.

5. The image sensor package according to claim 1, further comprising
an electrostatic discharge protection element, disposed on the fourth surface of the spacer and electrically connected with the spacer, or disposed on the first surface of the substrate and electrically connected with the substrate, wherein the electrostatic discharge protection element is connected in parallel with the at least one LED.

6. The image sensor package according to claim 1, wherein the difference of the height of the light input surface and the height of the light output surface is smaller than or equal to 0.8 mm.

7. The image sensor package according to claim 1, wherein the encapsulant body is made of an opaque resin or a semi-transparent resin.

8. The image sensor package according to claim 1, further comprising
a light-shielding layer, disposed on sidewalls of the image sensor or the LEDs.

9. The image sensor package according to claim 1, which comprises a plurality of light-emitting elements, wherein the plurality of light-emitting elements is separated apart from each other in space.

10. The image sensor package according to claim 1, which comprises a plurality of light-emitting elements, wherein the plurality of light-emitting elements emits lights having an identical wavelength or emits lights respectively having different wavelengths; alternatively, each light-emitting element includes a plurality of LEDs, and the plurality of LEDs emits lights having an identical wavelength or emits lights respectively having different wavelengths.

11. The image sensor package according to claim 1, further comprising
a plurality of cables, electrically connected with the plurality of corresponding first electric-conduction contacts.

12. The image sensor package according to claim 1, further comprising
a protective resin, covering connection points of the plurality of first electric-conduction contacts and the plurality of cables.

13. An endoscope, comprising
a tube, including a first opening and a second opening, wherein an end of the first opening of the tube is extended to a cavity, and the tube includes a working channel;
an image sensor package, disposed at the end of the first opening of the tube to capture images of the cavity and generate corresponding electronic signals, wherein the image sensor package includes
a substrate, having a first surface and a second surface opposite to the first surface, wherein the first surface has a plurality of first electric-conduction contacts; the second surface has a plurality of second electric-conduction contacts and a plurality of third electric-conduction contacts; the plurality of second electric-conduction contacts and the plurality of third electric-conduction contacts are respectively electrically connected with the plurality of corresponding first electric-conduction contacts, two corners at the upper edge of the substrate respectively have a chamfer, and a groove is formed at the lower edge of the substrate for accommodating the working channel;
an image sensor, disposed on the second surface of the substrate and electrically connected with the plurality of second electric-conduction contacts, wherein an upper edge and a lower edge of the image sensor are close to the edges of the substrate; and
at least one light-emitting element, disposed on the substrate with an offset relative to the image sensor such that the at least one light-emitting element is shifted toward the working channel, the light-emitting element, including:
a spacer, having a third surface and a fourth surface opposite to the third surface, wherein the third surface has a plurality of fourth electric-conduction contacts; the fourth surface has a plurality of fifth electric-conduction contacts; the plurality of fifth electric-conduction contacts is electrically connected with the plurality of corresponding fourth electric-conduction contacts; and
at least one light-emitting diode (LED), disposed on the fourth surface of the spacer and electrically connected with the plurality of fifth electric-conduction contacts,
wherein the light-emitting element is disposed on the second surface of the substrate and neighbors the image sensor; the plurality of fourth electric-conduction contacts is electrically connected with the plurality of corresponding third electric-conduction contacts; the spacer has a predetermined thickness to make a height of a light input surface of the image sensor greater than or equal to a height of a light output surface of the LED and make a difference of the height of the light input surface and the height of the light output surface smaller than or equal to a predetermined value;
an encapsulant body, disposed on sidewalls of the image sensor, the spacer and the LED, wherein a top surface of the package body is lower than or equal to a height of the at least one LED, and the encapsulant body does not cover a light-emitting surface of the at least one LED;
a plurality of cables, disposed inside the tube, wherein first connection ends of the plurality of cables are electrically connected with the plurality of corresponding first electric-conduction contacts of the substrate; and
an electric connector, disposed at the end of the second opening of the tube, and the electric connector electrically connected with second connection ends of the plurality of cables to enable the endoscope to be electrically connected with an external electronic device in a pluggable way.

14. The endoscope according to claim 13, further comprising
an electronic element, electrically connected with the image sensor package and the electric connector to process electronic signals generated by the image sensor package.

15. The endoscope according to claim 13, further comprising
a housing, disposed between the image sensor package and the electric connector.

16. The endoscope according to claim 13, wherein the image sensor package includes
a thermistor, used to detect an operation temperature of the image sensor package.

17. The endoscope according to claim 16, wherein the thermistor is disposed on the fourth surface of the spacer and electrically connected with a plurality of sixth electric-conduction contacts of the fourth surface, wherein the plurality of sixth electric-conduction contacts is electrically connected with the plurality of corresponding fourth electric-conduction contacts.

18. The endoscope according to claim 16, wherein the thermistor is disposed on the first surface of the substrate and electrically connected with a plurality of sixth electric-conduction contacts of the first surface, wherein the plurality of sixth electric-conduction contacts is electrically connected with the plurality of corresponding first electric-conduction contacts.

19. The endoscope according to claim 13, wherein the image sensor package further includes
an electrostatic discharge protection element, disposed on the fourth surface of the spacer and electrically connected with the spacer, or disposed on the first surface of the substrate and electrically connected with the substrate, wherein the electrostatic discharge protection element is connected in parallel with the at least one LED.

20. The endoscope according to claim 13, wherein the difference of the height of the light input surface and the height of the light output surface is smaller than or equal to 0.8 mm.

21. The endoscope according to claim 13, wherein the encapsulant body is made of an opaque resin or a semi-transparent resin.

22. The endoscope according to claim 13, wherein the image sensor package further includes a light-shielding layer, disposed on sidewalls of the image sensor or the LEDs.

23. The endoscope according to claim 13, wherein the image sensor package includes a plurality of light-emitting elements, and the plurality of light-emitting elements is separated apart from each other in space.

24. The endoscope according to claim 13, wherein the image sensor package includes a plurality of light-emitting elements; the plurality of light-emitting elements emits lights having an identical wavelength or emits lights respectively having different wavelengths; alternatively, each light-emitting element includes a plurality of LEDs, and the plurality of LEDs emits lights having an identical wavelength or emits lights respectively having different wavelengths.

25. The endoscope according to claim 13, wherein the image sensor package further includes
a protective resin, covering connection points of the plurality of first electric-conduction contacts and the plurality of cables.

* * * * *